United States Patent
Otaka et al.

(10) Patent No.: US 9,618,576 B2
(45) Date of Patent: Apr. 11, 2017

(54) APPARATUS FOR TESTING A SEMICONDUCTOR DEVICE AND METHOD OF TESTING A SEMICONDUCTOR DEVICE

(71) Applicant: HAMAMATSU PHOTONICS K.K., Hamamatsu-shi, Shizuoka (JP)

(72) Inventors: Akihiro Otaka, Hamamatsu (JP); Mitsunori Nishizawa, Hamamatsu (JP); Nobuyuki Hirai, Hamamatsu (JP); Tomonori Nakamura, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 317 days.

(21) Appl. No.: 14/552,926

(22) Filed: Nov. 25, 2014

(65) Prior Publication Data
US 2015/0153408 A1     Jun. 4, 2015

(30) Foreign Application Priority Data
Nov. 29, 2013   (JP) ................................. 2013-247143

(51) Int. Cl.
*G01R 31/308*   (2006.01)
*G01R 31/311*   (2006.01)

(52) U.S. Cl.
CPC .................................. *G01R 31/311* (2013.01)

(58) Field of Classification Search
CPC ............... G01R 31/04; G01R 31/2653; G01R 31/2884; G01R 31/305; G01R 31/307; G01R 31/311; G01R 1/071; G01R 31/26; G01R 31/2601; G01R 31/2851; G01R 31/308
See application file for complete search history.

(56) References Cited

U.S. PATENT DOCUMENTS

| | | | | |
|---|---|---|---|---|
| 5,666,062 | A * | 9/1997 | Takahashi | G01R 31/308 324/754.06 |
| 2012/0307249 | A1 | 12/2012 | Nakamura et al. | |
| 2015/0153408 | A1* | 6/2015 | Otaka | G01R 31/311 324/754.23 |

FOREIGN PATENT DOCUMENTS

| | | |
|---|---|---|
| JP | 2007-064975 A | 3/2007 |
| JP | 2010-271307 A | 12/2010 |
| JP | 2014-092514 A | 5/2014 |
| WO | WO-2007/136681 A2 | 11/2007 |

* cited by examiner

*Primary Examiner* — Tung X Nguyen
(74) *Attorney, Agent, or Firm* — Drinker Biddle & Reath LLP

(57) ABSTRACT

A semiconductor device measurement apparatus 1A includes a tester 2 that generates an operational pulse signal to be input to a semiconductor device 3, a light source 5 that generates light, a light branch optical system 6 that irradiates the semiconductor device with the light, a light detector 7 that detects reflected light obtained by the semiconductor device 3 reflecting the light, and outputs a detection signal, an analog signal amplifier 8 that amplifies the detection signal and outputs an amplified signal, and an analysis apparatus 10 that analyzes an operation of the semiconductor device 3 based on the amplified signal and a predetermined correction value, wherein the predetermined correction value is obtained based on a signal obtained by the analog signal amplifier 8 amplifying a signal corresponding to a harmonic of a fundamental frequency of the operational pulse signal.

18 Claims, 10 Drawing Sheets

1A

APPARATUS FOR TESTING A SEMICONDUCTOR DEVICE AND METHOD OF TESTING A SEMICONDUCTOR DEVICE

BACKGROUND OF THE INVENTION

Field of the Invention

The present invention relates to a semiconductor device measurement apparatus and a semiconductor device measurement method.

Related Background Art

A light probing technology referred to as EOP (Electro Optical Probing) or EOFM (Electro-Optical Frequency Mapping) is known as a technology for testing an integrated circuit. In the light probing technology, an integrated circuit is irradiated with light emitted from a light source, reflected light reflected by the integrated circuit is detected by an optical sensor, and a detection signal is acquired. Also, a desired frequency in the acquired detection signal is selected and amplitude energy thereof is displayed over time or displayed in two-dimensional mapping. Accordingly, a position of a circuit operating at the desired frequency can be identified.

Patent Document 1: Japanese Unexamined Patent Application Publication No. 2007-64975

Patent Document 2: Japanese Unexamined Patent Application Publication No. 2010-271307

The light probing technology as described above is a very effective technique since a fault location or a failure cause in a semiconductor device such as an integrated circuit can be identified and analyzed. Here, a time waveform of a detection signal acquired using the light probing technology may be distorted at a predetermined frequency. In this case, analysis precision may deteriorate.

Therefore, an object of the present invention is to provide a semiconductor device measurement apparatus and a semiconductor device measurement method having further improved analysis precision.

SUMMARY OF THE INVENTION

An apparatus for testing a semiconductor device of the present invention includes: an operational signal generator configured to generate an operational signal to the semiconductor device; a light source configured to generate light; an optics configured to illuminate the semiconductor device with the light; a detector configured to detect reflected light obtained by the semiconductor device reflecting the light, and output a detection signal; an amplifier configured to amplify the detection signal and output an amplified signal; and an analysis system configured to analyze an operation of the semiconductor device based on the amplified signal and a correction value, wherein the correction value is obtained based on a signal obtained by the amplifier amplifying a signal corresponding to a harmonic of a fundamental frequency of the operational signal.

In this apparatus, the correction value obtained based on the operational signal input to actually drive the semiconductor device is used at the time of analysis in the analysis system. Thus, since the correction value is a correction value according to the operational signal of the semiconductor device, it is possible to perform correction suitable for the operational signal, and improve correction precision. Further, since a cause of distortion of a time waveform of the detection signal is a non-uniform frequency characteristic of the amplifier, it is possible to appropriately correct the amplified signal output by the amplifier by using the correction value obtained based on the signal after the amplification in the amplifier. Thus, according to this apparatus, it is possible to improve analysis precision.

Further, the apparatus according to the present invention further includes a signal generator configured to generate a pulse signal, wherein the correction value is obtained by the signal generator sequentially generating a harmonic signal which is a pulse signal of an $n^{th}$ harmonic of the fundamental frequency. The correction value according to the operational signal of the semiconductor device can be derived by sequentially generating the pulse signal of the $n^{th}$ harmonic of the fundamental frequency.

Further, in the apparatus of the present invention, n is a positive integer. It is possible to reliably derive a desired correction value by generating the pulse signal of positive-integer order harmonics sequentially from a primary harmonic (fundamental wave).

Further, in the apparatus of the present invention, n is $2^m$, and m is 0 or a positive integer. It is possible to derive a desired correction value while shortening time required for correction value derivation by generating the pulse signal of $2^m$ order harmonics sequentially from the primary harmonic (fundamental wave).

Further, in the apparatus of the present invention, the pulse signal has a duty ratio ranging from 40% to 60%. It is possible to derive the correction value of the frequency component at a frequency of an odd number times a certain harmonic by the pulse signal having the duty ratio ranging from 40% to 60%. That is, it is possible to derive the correction value at the frequency of odd harmonics of such as third, fifth and seventh harmonics as well as a primary harmonic, for example, by generating the pulse signal of the primary harmonic having the duty ratio of 50%. Thus, for example, it is possible to derive all desired correction values if only the pulse signal of the $2^m$ order harmonic described above is generated. Thus, it is possible to shorten time required for correction value derivation.

Further, in the apparatus of the present invention, the correction value is obtained by the light source generating modulated light modulated based on the harmonic signal generated by the signal generator and the detector detecting the modulated light and outputting a detection signal of the harmonic signal. It is possible to easily perform the derivation of the correction value by the modulated light based on the harmonic signal being detected by the detector.

Further, in the apparatus of the present invention, the correction value is obtained by the harmonic signal generated by the signal generator being input to the amplifier. It is possible to easily perform derivation of the correction value without generating light by the harmonic signal from the signal generator being input to the amplifier.

Further, in the apparatus of the present invention, the analysis system corrects the amplified signal with the correction value, and reduces a high frequency component at a frequency higher than frequencies in a range in which the correction value is obtained among frequency components of the amplified signal after the correction. Accordingly, it is possible to suppress emphasis of noise of a high frequency component, which is not corrected with a correction value.

Further, in the apparatus of the present invention, the analysis system corrects the amplified signal with the correction value, and reduces a low frequency component lower than the fundamental frequency of the operational signal among frequency components of the amplified signal after the correction. Accordingly, it is possible to appropriately reduce noise of a low frequency component, which is difficult to reduce.

A method of testing a semiconductor device of the present invention includes generating an operational signal to be input to the semiconductor device; generating light; illuminating the semiconductor device with the light; detecting reflected light obtained by the semiconductor device reflecting the light, and outputting a detection signal; by amplifier, amplifying the detection signal and outputting an amplified signal; and analyzing an operation of the semiconductor device based on the amplified signal and a correction value, wherein the correction value is obtained based on a signal obtained by the amplifier amplifying a signal corresponding to a harmonic of a fundamental frequency of the operational signal.

DESCRIPTION OF THE PREFERRED EMBODIMENTS

Hereinafter, preferred embodiments of the present invention will be described in detail with reference to the drawings. Further, the same or corresponding portions are denoted with the same reference signs in the respective drawings and repeated description is omitted.

Figure 1:
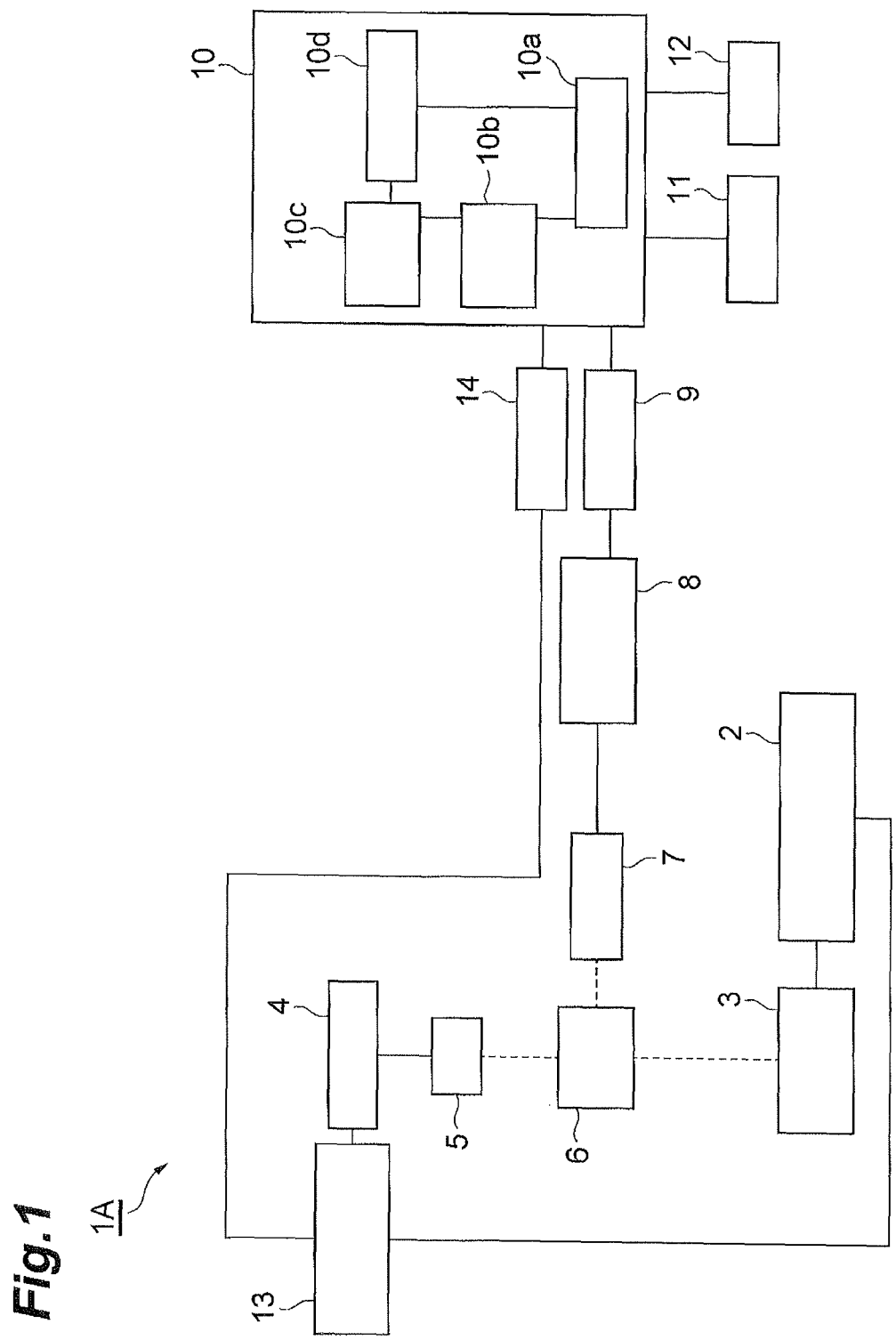
FIG. 1 is a diagram illustrating a configuration of a semiconductor device measurement apparatus of a first embodiment of the present invention.

[First embodiment] A semiconductor device measurement apparatus 1A according to a first embodiment is an apparatus for testing (measuring) a semiconductor device 3 that is a device under test (DUT), such as identifying a location in which an abnormality occurs in the semiconductor device 3, as illustrated in FIG. 1. Specifically, the semiconductor device measurement apparatus 1A is a frequency analysis apparatus that performs frequency analysis of a response to an operation signal of the semiconductor device 3, which is a measurement target.

The semiconductor device 3 includes, for example, an integrated circuit having a PN junction of a transistor or the like (for example, small scale integration (SSI), medium scale integration (MSI), large scale integration (LSI), very large scale integration (VLSI), ultra large scale integration (ULSI), or giga scale integration (GSI)), or a MOS transistor and a bipolar transistor for a high current and a high voltage. Further, the semiconductor device 3 may be a power semiconductor device (power device) or the semiconductor device 3 may be a semiconductor device in which modulation by heat is applied to a substrate.

The semiconductor device measurement apparatus 1A includes a tester 2, a light source control unit 4, a light source 5, a light branch optical system 6, a light detector 7, an analog signal amplifier 8, an A/D converter 9, an analysis apparatus 10, a display unit 11, and an input device 12.

The tester 2 is an operational pulse signal generation unit that generates an operational pulse signal to be input to the semiconductor device 3. The semiconductor device 3 is driven by a predetermined operational pulse signal input by the tester 2. The tester 2 can perform a test in a desired operating state of the semiconductor device 3 by inputting the operational pulse signal (test pattern) corresponding to driving desired to be tested to the semiconductor device 3.

The tester 2 includes a pulse generator that generates the test pattern. The test pattern is generated based on a reference clock which is a pulse signal at a reference frequency, and includes a repetition of a predetermined pulse signal string (see FIG. 2). Therefore, a highest frequency of the test pattern is a reference frequency of the reference clock. A period of the repetition of the predetermined pulse signal string is a fundamental period of the test pattern, and a frequency of the repetition of the predetermined pulse signal string is a fundamental frequency of the test pattern (see FIG. 2).

The light source 5 is a light generation unit which generates light based on a control signal from the light source control unit 4 and outputs irradiation light. The light source 5 includes an SLD (Super Luminescent Diode). Further, the light source 5 may be, for example, a laser light source such as an LD (Laser Diode), an LED (Light Emitting Diode), or a light source using a lamp light source. Further, the irradiation light may be pulse light.

The light branch optical system 6 is a light irradiation unit that irradiates the semiconductor device 3 with the irradiation light output from the light source 5. The light branch optical system 6 may further include a light scanning optical system that scans the semiconductor device 3 with the irradiation light. Further, the light branch optical system 6 guides reflected light reflected by the semiconductor device 3 for the irradiation light to the light detector 7. The reflected light is guided to the light detector 7 through an optical fiber for return light.

The light detector 7 is a light detection unit that detects the reflected light guided by the light branch optical system 6 and outputs a detection signal which is an analog signal. The light detector 7 is, for example, an APD (Avalanche PhotoDiode), a PD (PhotoDiode), or a PMT (PhotoMultiplier Tube). Since the reflected light is modulated according to the operational pulse signal input to the semiconductor device 3, the light detector 7 is regarded as detecting a signal from the semiconductor device 3 operating based on the operational pulse signal, and can output a detection signal as a response to the operational pulse signal input to the semiconductor device 3. The detection signal output by the light detector 7 is input to the analog signal amplifier 8.

The analog signal amplifier 8 is an amplification unit that amplifies the detection signal from the light detector 7, and outputs an amplified signal. The A/D (analog/digital) converter 9 converts the amplified signal which is an analog signal into a digital signal and outputs the digital signal. The A/D converter 9 is, for example, a digitizer.

The analysis apparatus 10 is an analysis unit that analyzes an operation of the semiconductor device 3 based on the digital signal (the amplified signal) from the A/D converter 9 and a predetermined correction value $A(\omega)$ and is, for example, a computer such as a PC (Personal Computer). Specifically, the analysis apparatus 10 corrects the amplified signal with predetermined correction value $A(\omega)$ and analyzes the amplified signal after the correction. The analysis device 10 includes a waveform acquisition unit 10a, a correction value calculation unit 10b, a correction value storage unit 10c, and a waveform correction unit 10d. The correction value calculation unit 10b is configured to perform a process of deriving the correction value $A(\omega)$. The process of deriving a correction value will be described below.

The waveform acquisition unit 10a acquires a time waveform I(t) of the amplified signal based on the digital signal from the A/D converter 9. The correction value storage unit 10c stores the predetermined correction value $A(\omega)$ for each frequency component for correcting a frequency characteristic of the analog signal amplifier 8. The correction value $A(\omega)$ is obtained based on a signal obtained by the analog signal amplifier 8 amplifying a signal corresponding to a harmonic of the fundamental frequency of the operational pulse signal, and is an S parameter (scattering matrix) or a transfer function. The process of deriving a correction value $A(\omega)$ will be described below.

The waveform correction unit 10d corrects a time waveform I(t) of the amplified signal acquired by the waveform acquisition unit 10a with the predetermined correction value $A(\omega)$ stored in the correction value storage unit 10c. Specifically, the waveform correction unit 10d performs a Fourier transform on the time waveform I(t) of the amplified signal to convert the time waveform I(t) into a frequency spectrum $I(\omega)$. Further, the waveform correction unit 10d corrects the frequency spectrum $I(\omega)$ with the predetermined correction value $A(\omega)$. Specifically, the waveform correction unit 10d acquires a frequency spectrum $I'(\omega)$ after the correction by dividing the frequency spectrum $I(\omega)$ by the correction value $A(\omega)$ of a corresponding frequency component stored in the correction value storage unit 10c.

Further, the waveform correction unit 10d reduces high frequency components at frequencies equal to or higher than a predetermined frequency in the frequency spectrum $I'(\omega)$ after the correction. The predetermined frequency is a frequency equal to or higher than a frequency at which the correction value $A(\omega)$ is not derived. In the frequency spectrum $I'(\omega)$ after the correction, frequency components at frequencies equal to or higher than the frequency at which the correction value $A(\omega)$ is not derived are not corrected. Therefore, when noise is contained in a frequency band not subjected to the correction, a time waveform in which the noise is emphasized is obtained. In order to prevent such a situation, the waveform correction unit 10d performs, for example, low-pass filter processing for cutting the high frequency components at which the correction value $A(\omega)$ is not derived or window function processing for reducing the high frequency components, to reduce the high frequency components at frequencies equal to or higher than the predetermined frequency. Further, the process of reducing the high frequency component may be performed before the correction process based on the correction value $A(\omega)$ described above. A case in which the high frequency component is reduced and completely eliminated may be included in the reduction of the high frequency component.

Further, waveform correction unit 10d reduces low frequency components equal to or less than the predetermined frequency in the frequency spectrum $I'(\omega)$ after the correction. It may be difficult to completely correct a low frequency noise of the analog signal amplifier 8 due to characteristics of the analog signal amplifier 8 even when the frequency characteristic of the analog signal amplifier 8 is corrected by correction value $A(\omega)$. Therefore, the waveform correction unit 10d reduces at least the same frequency component as the fundamental frequency of the operational pulse signal driving the semiconductor device 3 in order to reduce unnecessary low frequency noise. A case in which the low frequency component is reduced and completely eliminated may be included in the reduction of the low frequency component.

Further, the waveform correction unit 10d converts the frequency spectrum $I'(\omega)$ in which the high frequency components are reduced and low frequency components are reduced after the correction into a time waveform using an inverse Fourier transform. The waveform correction unit 10d outputs information on the time waveform.

Further, functions of both of the A/D converter 9 and the analysis apparatus 10 may be realized by a PC having the same function as the A/D converter 9 described above. Further, a configuration in which the time waveform signal that is a digital signal is acquired by an oscilloscope having the function of the A/D converter 9 and the function of the waveform acquisition unit 10a in the analysis apparatus 10, and the acquired time waveform signal is input to a PC which is the analysis apparatus 10 may be adopted.

The display unit 11 is a display unit (display) that displays the time waveform after the correction output by the waveform correction unit 10d of the analysis apparatus 10. Further, the input device 12 includes a keyboard or a mouse and inputs measurement conditions such as a measurement range or a measurement position.

Figure 3:
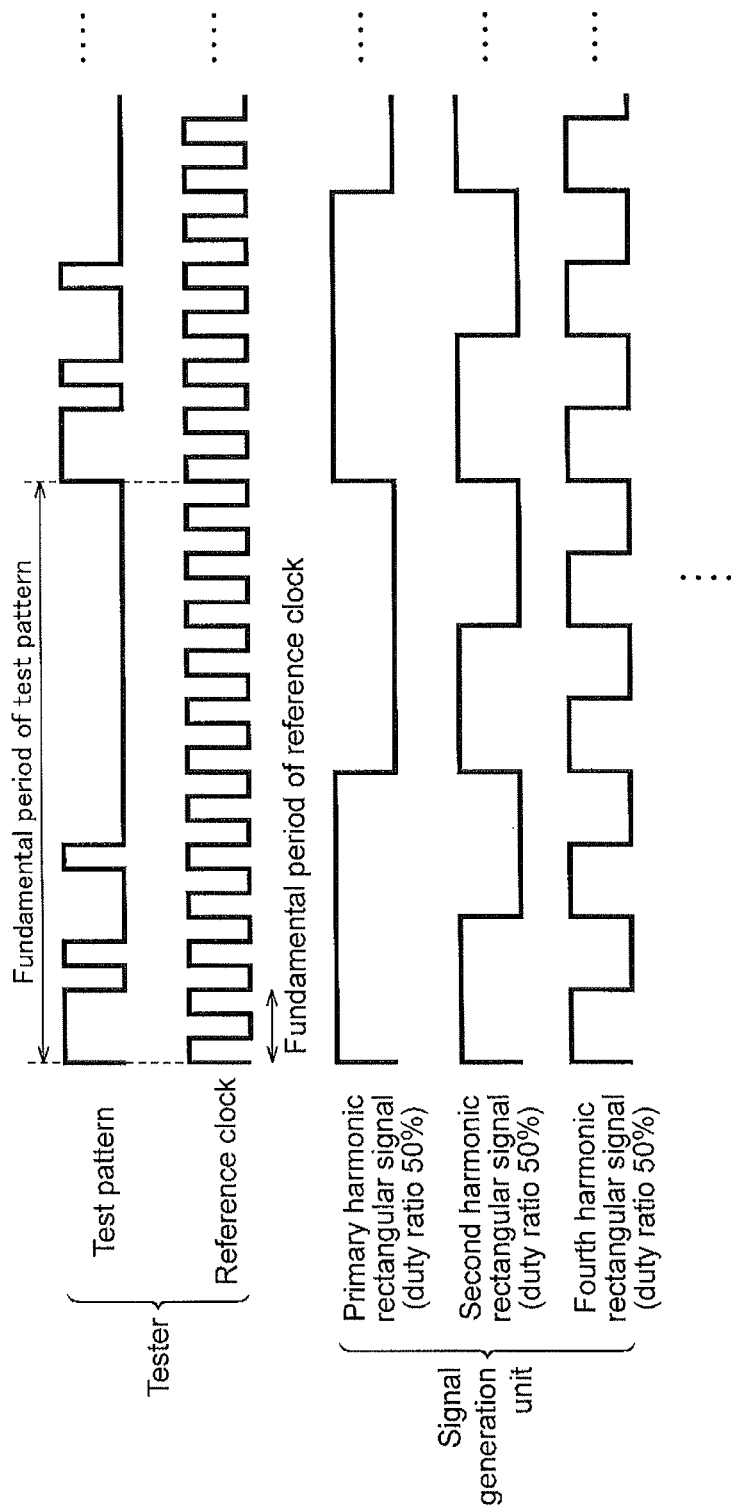
FIG. 3 is a diagram illustrating an example of a test pattern output by an amplifier and a harmonic signal generated by a signal generation unit.
Figure 4:
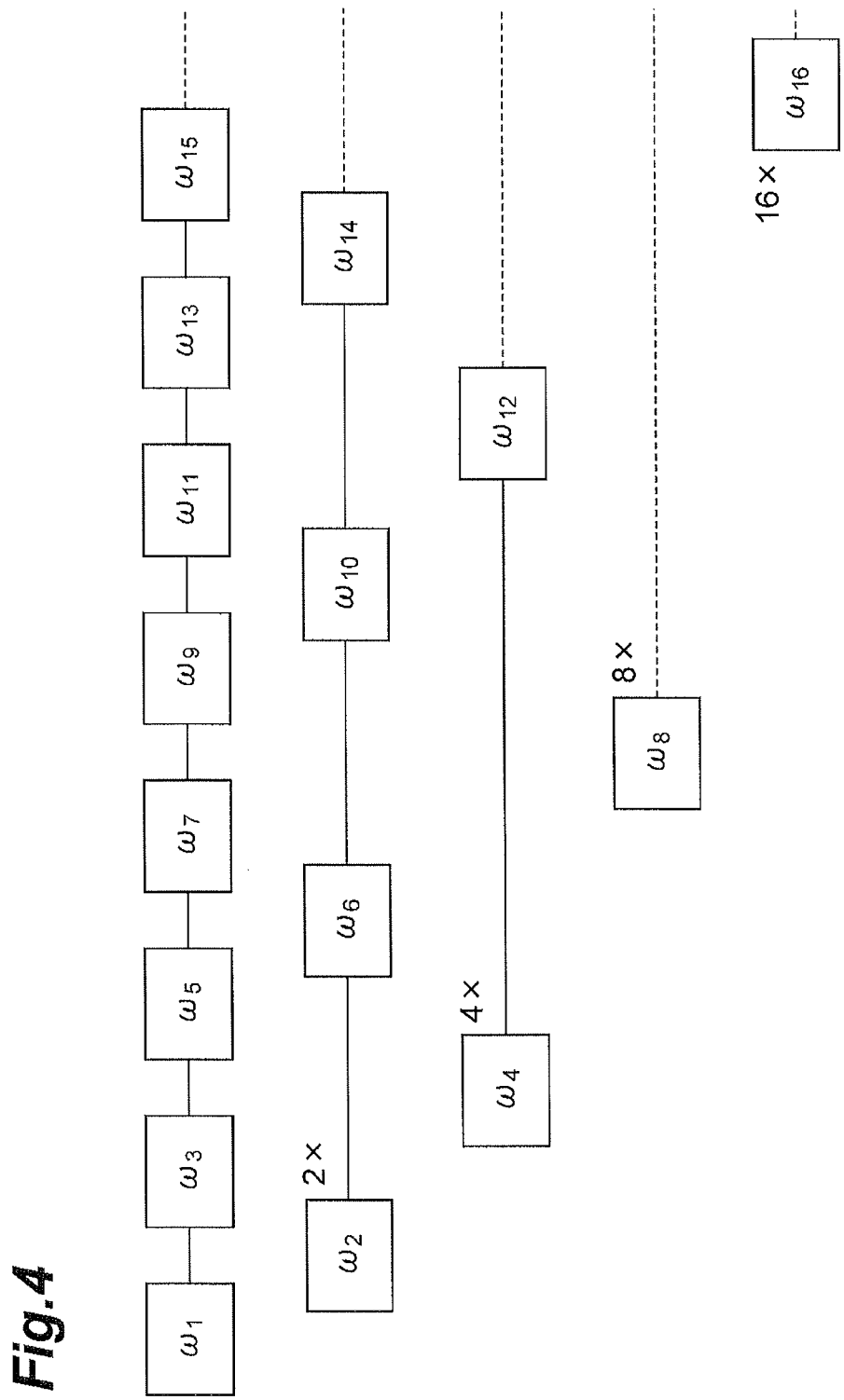
FIG. 4 is a diagram illustrating a derivation image for a correction value.

Next, a configuration according to the process of deriving a correction value $A(\omega)$ will be described with reference to FIGS. 2 to 4. The semiconductor device measurement apparatus 1A includes a signal generation unit 13 electrically connected to the tester 2 and the light source control unit 4, and an A/D converter 14 electrically connected to the signal generation unit 13, as a configuration according to the process of deriving a correction value $A(\omega)$.

The signal generation unit 13 acquires information on the fundamental frequency of the test pattern from the tester 2, and generates a pulse signal based on the information on the fundamental frequency. This pulse signal has, for example, a rectangular shape. The information on the fundamental frequency is, for example, the fundamental frequency, a fundamental period, the number of reference clocks for the fundamental frequency, and a period of the reference clock (see FIG. 2). Further, the signal generation unit 13 may acquire the test pattern from the tester 2. The signal generation unit 13 includes a pulse generator, and a pulse signal is generated by the pulse generator.

Specifically, the signal generation unit 13 sequentially generates a harmonic signal which is a pulse signal of an $n^{th}$ harmonic of the fundamental frequency. n is, for example, a positive integer. The signal generation unit 13 generates the pulse signal up to the $n^{th}$ harmonic which is a frequency component necessary for correction in order of a second harmonic (n=2), a third harmonic (n=3), . . . , sequentially from a primary harmonic (n=1) that is a fundamental wave.

Figure 2:
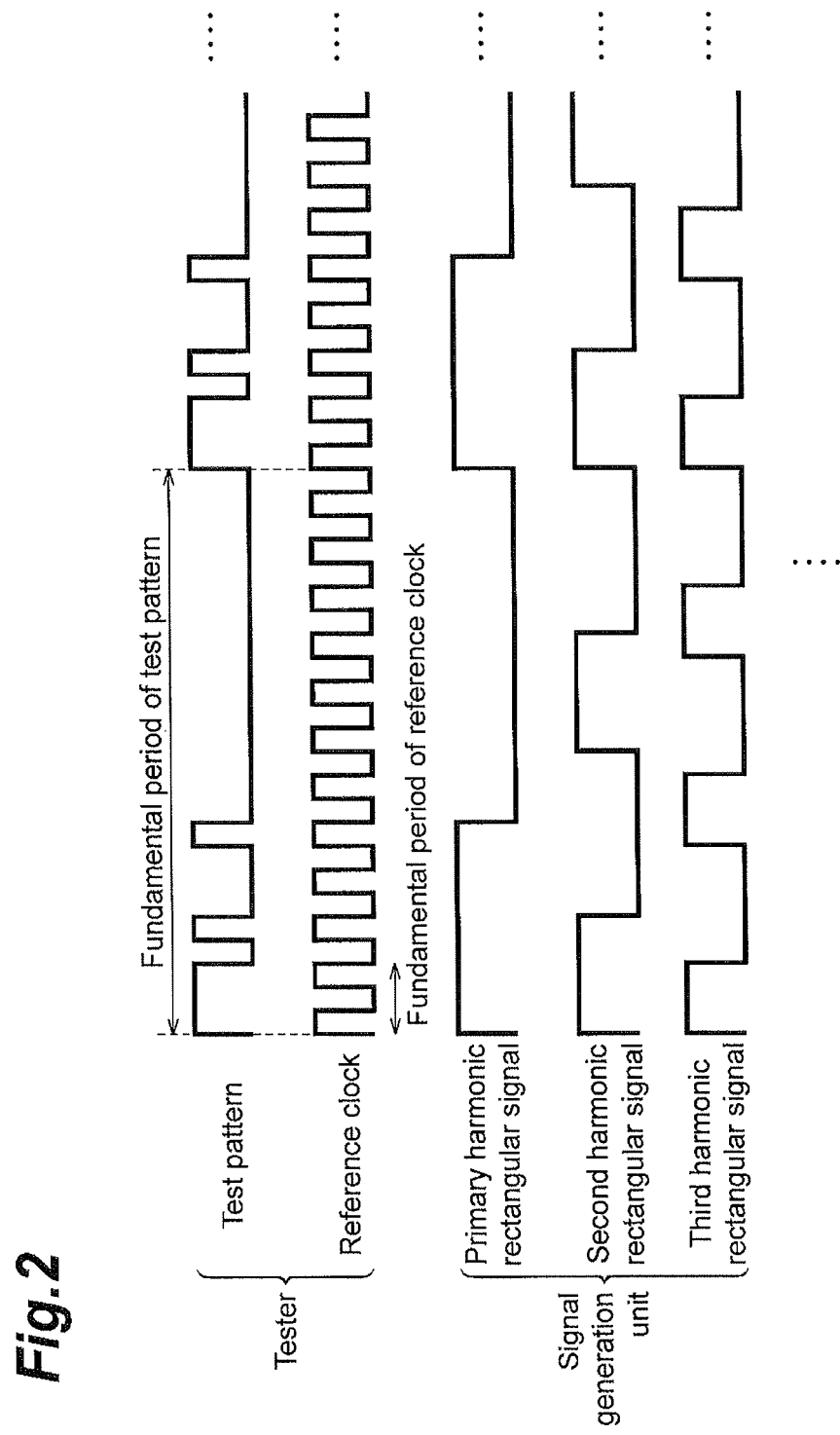
FIG. 2 is a diagram illustrating an example of a test pattern output by an amplifier and a harmonic signal generated by a signal generation unit.

In the example illustrated in FIG. 2, the signal generation unit 13 sequentially generates and outputs a pulse signal of the primary harmonic of the fundamental frequency of the test pattern, a pulse signal of the second harmonic, a pulse signal of the third harmonic, . . . , a pulse signal of the $n^{th}$ order harmonic, based on information on the fundamental frequency of the test pattern input from the tester 2 to the semiconductor device 3 (information of any one of the fundamental frequency, the fundamental period, the number of reference clocks for the fundamental frequency, and the period of the reference clock). In this case, the duty ratio of the pulse signal is not particularly limited. Further, it is preferable for the signal generation unit 13 to generate at least the pulse signal of the $n^{th}$ harmonic up to an order n which is a value of the fundamental frequency of the test pattern/the frequency of the reference clock.

The signal generation unit 13 inputs the generated pulse signal to the light source control unit 4 and the A/D converter 14. The A/D converter 14 converts the pulse signal into a digital signal and outputs the digital signal. The digital signal output by the A/D converter 14 is acquired as an input waveform IN(t) of the analog signal amplifier 8 by the waveform acquisition unit 10a.

The light source control unit 4 inputs a control signal to the light source 5 so that the irradiation light emitted from the light source 5 is modulated based on the pulse signal (harmonic signal) input by the signal generation unit 13. Also, the light source 5 generates modulated light that is irradiation light modulated based on the control signal. The modulated light is modulated to have the same waveform as the pulse signal of the harmonic signal generated by the signal generation unit 13.

Here, when the correction value $A(\omega)$ is to be derived, input of the operational pulse signal from the tester 2 to the semiconductor device 3 is not performed. Therefore, the semiconductor device 3 is not driven and merely serves as a mirror for the irradiated light (the modulated light). Thus, the reflected light of the semiconductor device 3 for the modulated light generated by the light source 5 described above maintains the same waveform as the modulated light, that is, the same waveform as the pulse signal of the harmonic signal generated by the signal generation unit 13.

Also, the reflected light (i.e., the modulated light) of the semiconductor device 3 for the modulated light is detected by the light detector 7 and output as the detection signal which is an analog signal. The detection signal is a signal corresponding to the harmonic of the fundamental frequency of the operational pulse signal, and is amplified by the analog signal amplifier 8, digitally converted by the A/D converter 9, and acquired as an output waveform OUT(t) from the analog signal amplifier 8 by the waveform acquisition unit 10a.

The input waveform IN(t) and the output waveform OUT(t) acquired by the waveform acquisition unit 10a are subjected to a Fourier transform by the correction value calculation unit 10b. The correction value calculation unit 10b derives the correction value $A(\omega)$ at each frequency by dividing the input waveform IN($\omega$) converted into frequency components by the output waveform OUT($\omega$), as shown in Equation (1) below.

[Equation 1]

$$A(\omega) = IN(\omega)/OUT(\omega) \quad (1)$$

The above is a description of the configuration according to the process of deriving a correction value $A(\omega)$. The correction value $A(\omega)$ derived by the correction value calculation unit 10b is stored in the correction value storage unit 10c.

Here, the signal generation unit 13 may cause all the generated pulse signals of the $n^{th}$ harmonic to be pulse signals having a duty ratio ranging from 40% to 60%. Most preferably, the pulse signals may be pulse signals having the duty ratio of 50%. For example, when the pulse signal of the primary harmonic (frequency $\omega$) having a duty ratio of 50% is Fourier-developed, the pulse signal is as shown in Equation (2) below.

[Equation 2]

$$f(t) = \frac{4}{\pi}\left\{\sin \omega t + \frac{1}{3}\sin 3\omega t + \frac{1}{5}\sin 5\omega t + \frac{1}{7}\sin 7\omega t + \frac{1}{9}\sin 9\omega t + ...\right\} \quad (2)$$

Frequency components ($3\omega$, $5\omega$, ...) of an odd number times the frequency $\omega$ of the primary harmonic are contained in the Fourier-developed pulse signal, as seen from Equation (2) above. The odd frequency components, that is, the frequency component of a third harmonic or a fifth harmonic as well as the primary harmonic, are contained in the pulse signal of the primary harmonic, as illustrated in FIG. 4. Further, in FIG. 4, a subscript attached to $\omega$ indicates a frequency in a harmonic having a numerical value of the subscript as an order. That is, for example, $\omega_3$ indicates a frequency of a third harmonic.

Thus, the signal generation unit 13 generates the pulse signal of the primary harmonic having the duty ratio of 50%, such that all correction values $A(\omega)$ in the frequency of the odd-numbered harmonic can be derived. Also, when the pulse signal of the second ($2^1$) harmonic is generated subsequent to the primary ($2^0$) harmonic by the signal generation unit 13, all correction values $A(\omega)$ at the frequency of a $2^{odd-number}$ order harmonic can be derived since a frequency component of an odd number times the second harmonic, that is, a frequency component of a sixth harmonic or a tenth harmonic, as well as the second harmonic, is contained in the pulse signal of the second harmonic. Similarly, when a pulse signal of a fourth ($2^2$) harmonic is generated by the signal generation unit 13, all correction values $A(\omega)$ in a frequency of a $4^{odd-number}$ order harmonic can be derived since a frequency component of an odd number times the fourth harmonic, that is, a frequency component of a twelfth harmonic or a twentieth harmonic, as well as the fourth harmonic, is contained in the pulse signal of the fourth harmonic. Therefore, when the pulse signal of the $n^{th}$ order harmonic generated by the signal generation unit 13 is a pulse signal having a duty ratio ranging from 40% to 60%, the correction value $A(\omega)$ in the frequency of an odd number times the frequency of such a harmonic can be collectively obtained by the signal generation unit 13 generating the pulse signals of the primary harmonic and an even-numbered harmonic. Particularly, if the pulse signal has the duty ratio of a value of about 50%, a value of a frequency component of an odd number times the frequency is high. Accordingly, it is possible to reliably acquire the correction value $A(\omega)$.

Thus, when m is 0 or a positive integer, the signal generation unit 13 generates a pulse signal of a $2^m$ order harmonic, in which $n=2^m$. Accordingly, the number of times the signal is generated greatly decreases in comparison with a case in which the pulse signal is sequentially generated from a primary harmonic to an $n^{th}$ harmonic, in which n is a positive integer. Further, the derivation of the correction value $A(\omega)$ may be performed from the fundamental frequency to near a frequency at which a frequency characteristic of the analog signal amplifier 8 becomes a constant value if visually sufficient correction is performed when the time waveform after the correction is viewed. Further, when the correction is strictly performed up to a high frequency, the derivation of the correction value $A(\omega)$ may be performed until the correction value $A(\omega)$ from a frequency of the fundamental frequency of the test pattern to a frequency of the reference frequency of the reference clock is obtained.

Figure 5:
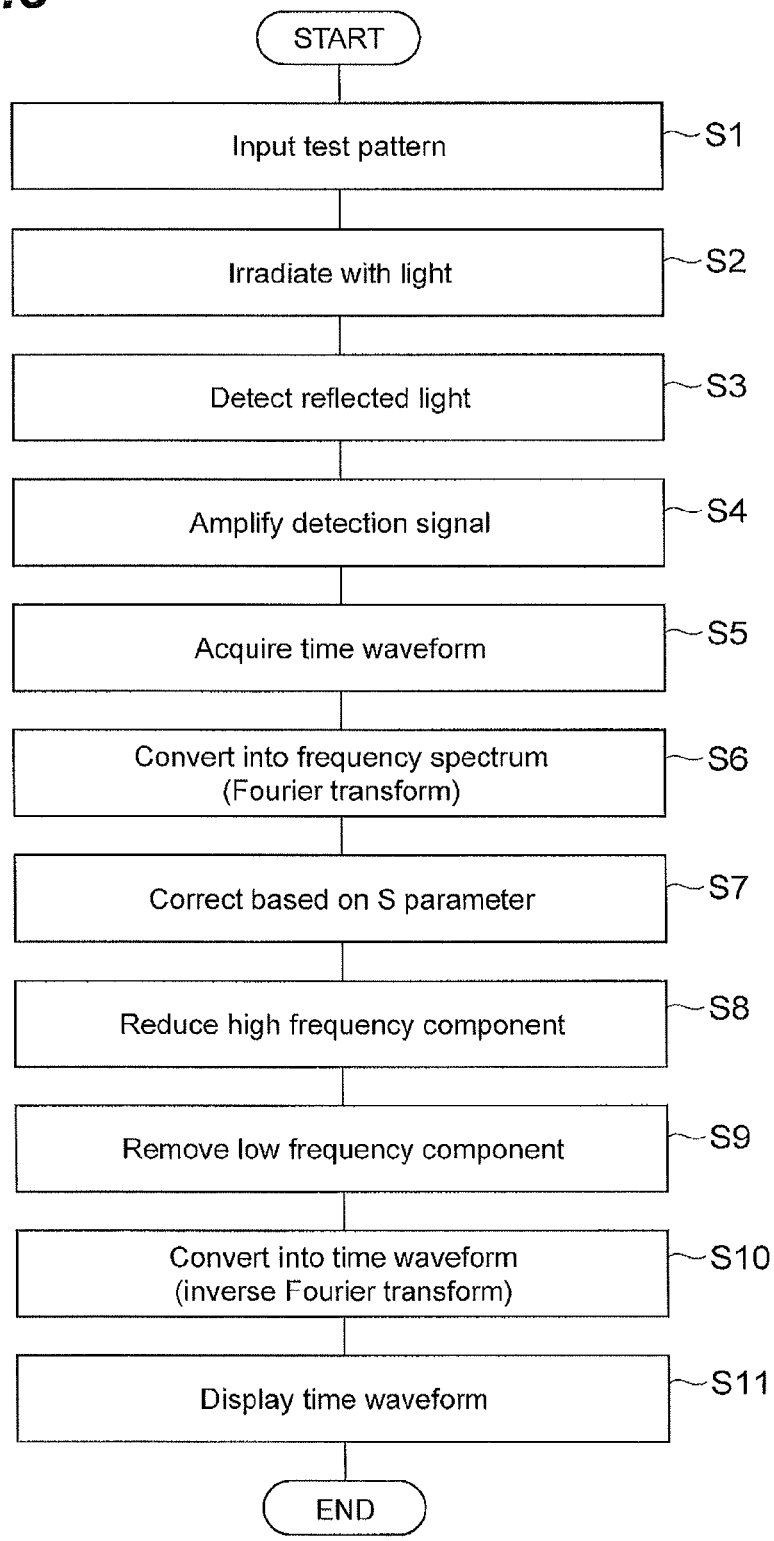
FIG. 5 is a flow diagram illustrating a measurement process in the semiconductor device measurement apparatus.

Next, a measurement process in the semiconductor device measurement apparatus 1A will be described with reference to FIG. 5. Further, as a premise of the measurement process, the correction value $A(\omega)$ at each frequency is stored in the correction value storage unit 10c.

First, an operational pulse signal (test pattern) is input to the semiconductor device 3 by the tester 2 (step S1). Then, the semiconductor device 3 is irradiated with the irradiation light output by the light source 5 through the light branch optical system 6 (step S2). Then, the reflected light from the semiconductor device 3 is detected by the light detector 7 and output as a detection signal (step S3). Then, the detection signal is amplified by the analog signal amplifier 8 and output as an amplified signal (step S4).

The amplified signal is converted to a digital signal by the A/D converter 9, and then a time waveform I(t) is acquired by the waveform acquisition unit 10a of the analysis apparatus 10 (step S5). Also, the time waveform I(t) of the amplified signal is subjected to a Fourier transform in the frequency spectrum $I(\omega)$ by the waveform correction unit 10d (step S6). Then, the frequency spectrum $I(\omega)$ is corrected with the correction value $A(\omega)$ such as the S parameter by the waveform correction unit 10d, and the frequency spectrum $I'(\omega)$ after the correction is derived. Then, a high frequency component of the frequency spectrum $I'(\omega)$ after the correction is reduced by the waveform correction unit 10d (step S8), and a low frequency component is reduced (step S9).

Then, the frequency spectrum $I'(\omega)$ is converted into a time waveform through an inverse Fourier transform by the waveform correction unit 10d (step S10). Finally, the time waveform after the correction is displayed by the display unit 11 (step S11). This is the measurement process in the semiconductor device measurement apparatus 1A.

Next, an operation and effect of the semiconductor device measurement apparatus 1A according to the first embodiment will be described.

In this semiconductor device measurement apparatus 1A, the correction value $A(\omega)$ obtained based on the operational pulse signal input to actually drive the semiconductor device measurement apparatus 1A is used when the frequency spectrum $1(\omega)$ is corrected based on the time waveform I(t). Thus, since the correction value $A(\omega)$ depends on the operational pulse signal of the semiconductor device measurement apparatus 1A, correction suitable for the operational pulse signal can be performed and correction precision can be improved.

Figure 6:
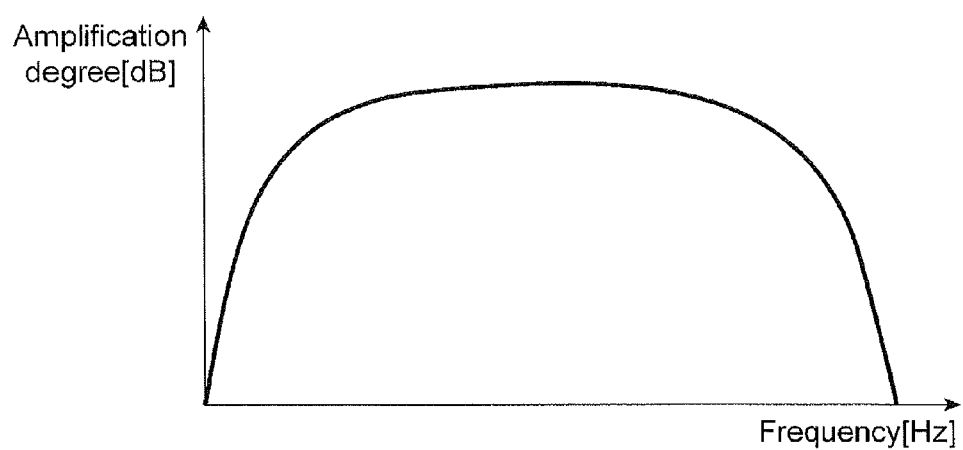
FIG. 6 is a diagram illustrating a frequency characteristic of an amplification unit.
Figure 7:
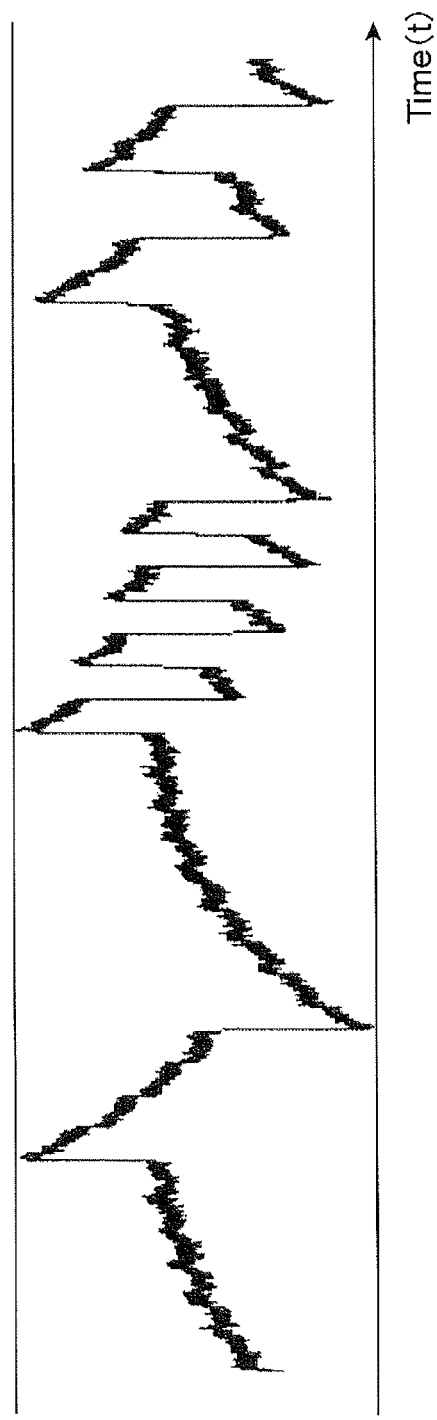
FIG. 7 is a diagram illustrating a time waveform in low frequency measurement.

Here, for example, when the time waveform of the low frequency is acquired, a phenomenon in which the acquired time waveform is distorted as illustrated in FIG. 7 may occur. The inventors' intensive investigations showed that a cause of the phenomenon is that an amplifier has non-uniform frequency characteristics and an amplification degree varying with a frequency, as illustrated in FIG. 6.

Based on such findings, in the semiconductor device measurement apparatus 1A according to this embodiment, the correction of the frequency spectrum $I(\omega)$ is performed using the correction value $A(\omega)$ for each frequency obtained based on the output waveform OUT(t) amplified by the analog signal amplifier 8. Accordingly, the amplified signal after amplification in the analog signal amplifier 8 can be appropriately corrected. Thus, according to this semiconductor device measurement apparatus 1A, it is possible to improve analysis precision by appropriately correcting the amplified signal.

Further, the semiconductor device measurement apparatus 1A includes the signal generation unit 13 that generates a pulse signal, and the signal generation unit 13 derives a predetermined correction value $A(\omega)$ by sequentially generating the harmonic signal which is a pulse signal of an $n^{th}$ harmonic of the fundamental frequency. Thus, it is possible to derive the correction value according to the operational pulse signal of the semiconductor device 3 by sequentially generating the pulse signal of the $n^{th}$ harmonic of the fundamental frequency.

Further, n is a positive integer, such that a pulse signal of positive-integer order harmonics can be generated sequentially from a primary harmonic, and a desired correction value $A(\omega)$ can be reliably derived. Further, when n is $2^m$ and m is 0 or a positive integer, the signal generation unit 13 generates a pulse signal of a $2^m$ order harmonic. In this case, a time required for derivation of the correction value $A(\omega)$ can be shortened in comparison with a case in which the pulse signal of positive-integer order harmonics is sequentially generated from the primary harmonic. Further, it is possible to derive a correction value $A(\omega)$ of a harmonic component of an odd number times a certain harmonic by using the pulse signal having the duty ratio ranging from 40% to 60%. That is, for example, it is possible to derive a correction value $A(\omega)$ at frequencies of odd harmonics such as third, fifth, and seventh harmonics, as well as the primary harmonic, by generating the pulse signal of the primary harmonic having the duty ratio of 50%. Thus, when only the pulse signal of a $2^m$ order harmonic described above is generated, it is possible to derive all desired correction values $A(\omega)$. Thus, it is possible to reduce the number of times the signal is generated in the signal generation unit 13 and to shorten time required for derivation of the correction value $A(\omega)$.

Further, the light source 5 generates the modulated light modulated based on the harmonic signal generated by the signal generation unit 13, and the light detector 7 detects the reflected light (i.e., the modulated light) of the semiconductor device 3 and outputs the reflected light as the detection signal, such that the predetermined correction value $A(\omega)$ is derived. Thus, the modulated light based on the harmonic signal is detected by the light detector 7, such that derivation of the correction value $A(\omega)$ can be easily performed.

Further, the waveform correction unit 10d can suppress emphasis of noise of the high frequency component, which is not corrected with the predetermined correction value $A(\omega)$, by reducing the high frequency component at a frequency higher than frequencies in a range in which the correction value $A(\omega)$ is obtained in the frequency spectrum $I'(\omega)$ of the amplified signal after the correction.

Further, the waveform correction unit 10d can appropriately reduce noise of a low frequency component, which is difficult to reduce, by reducing a low frequency component at a frequency equal to or lower than the fundamental frequency of the operational pulse signal in the frequency spectrum $I'(\omega)$ of the amplified signal after the correction.

[Second embodiment] Next, a semiconductor device measurement apparatus 1B according to a second embodiment will be described with reference to FIG. 8. Further, in description of this embodiment, differences from the embodiment described above will be mainly described.

Figure 8:
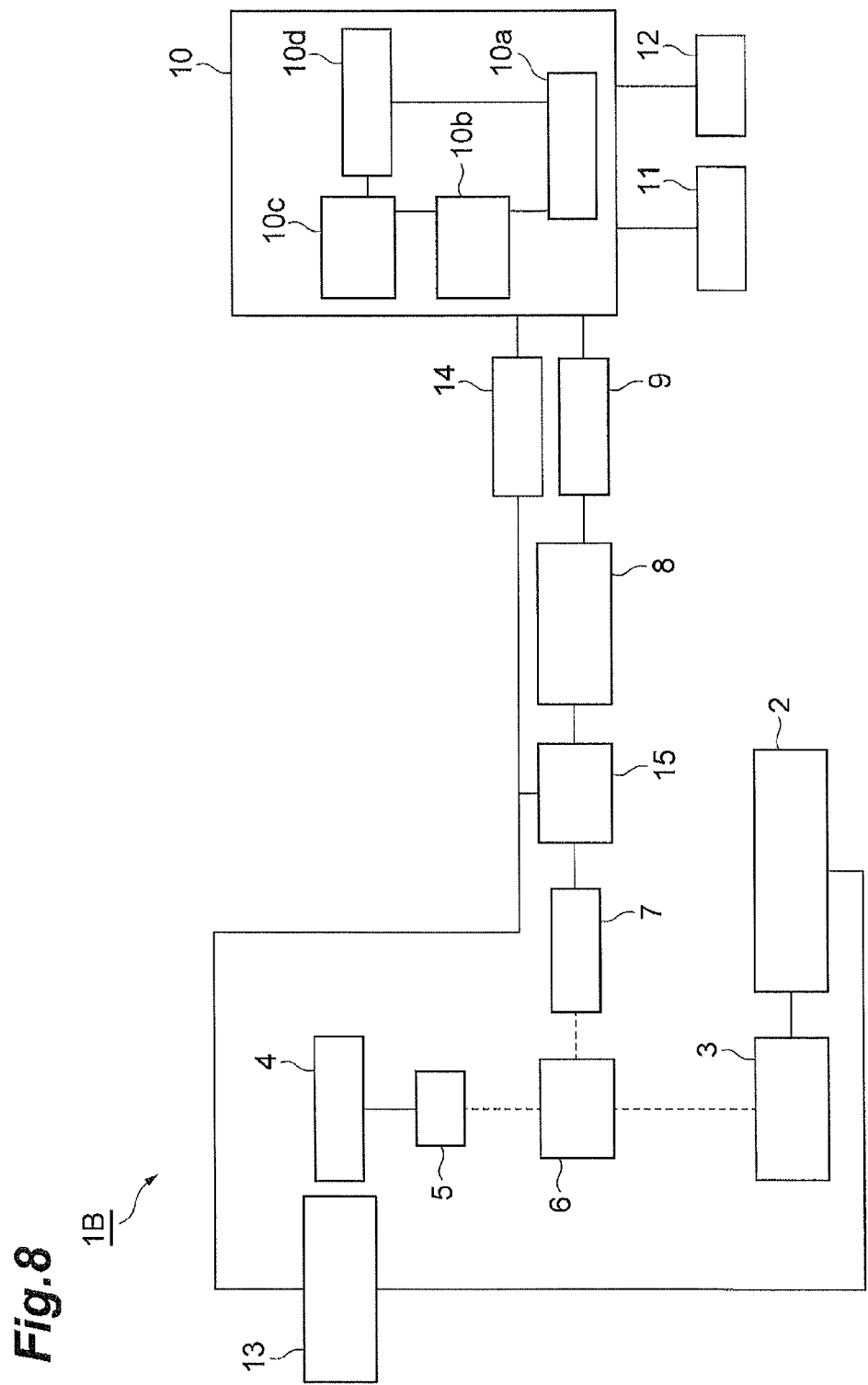
FIG. 8 is a diagram illustrating a configuration of a semiconductor device measurement apparatus of a second embodiment of the present invention.

In a semiconductor device measurement apparatus 1B according to the second embodiment, a switch unit 15 is provided between a light detector 7 and an analog signal amplifier 8, and the switch unit 15 and a signal generation unit 13 are electrically connected, as illustrated in FIG. 8.

The switch unit 15 has a different connection state between a case in which a measuring process is performed and a case in which a process of deriving a correction value A(ω) in the semiconductor device measurement apparatus 1B. That is, the switch unit 15 electrically connects the light detector 7 and the analog signal amplifier 8 when the measurement is performed, and electrically connects the signal generation unit 13 and the analog signal amplifier 8 when the process of deriving a correction value A(ω) is performed.

In the process of deriving a correction value A(ω), in the first embodiment described above, a signal corresponding to the pulse signal is input to the analog signal amplifier 8 by modulating the light from the light source 5 based on the harmonic signal from the signal generation unit 13 and detecting the modulated signal using the light detector 7, whereas in the second embodiment, the harmonic signal generated by the signal generation unit 13 is directly input to the analog signal amplifier 8 as the signal corresponding to the harmonic at the fundamental frequency of the operational pulse signal since the signal generation unit 13 and the analog signal amplifier 8 are electrically connected by the switch unit 15. Thus, it is possible to easily perform the derivation of the correction value A(ω) without generating the irradiation light from the light source 5.

Figure 9:
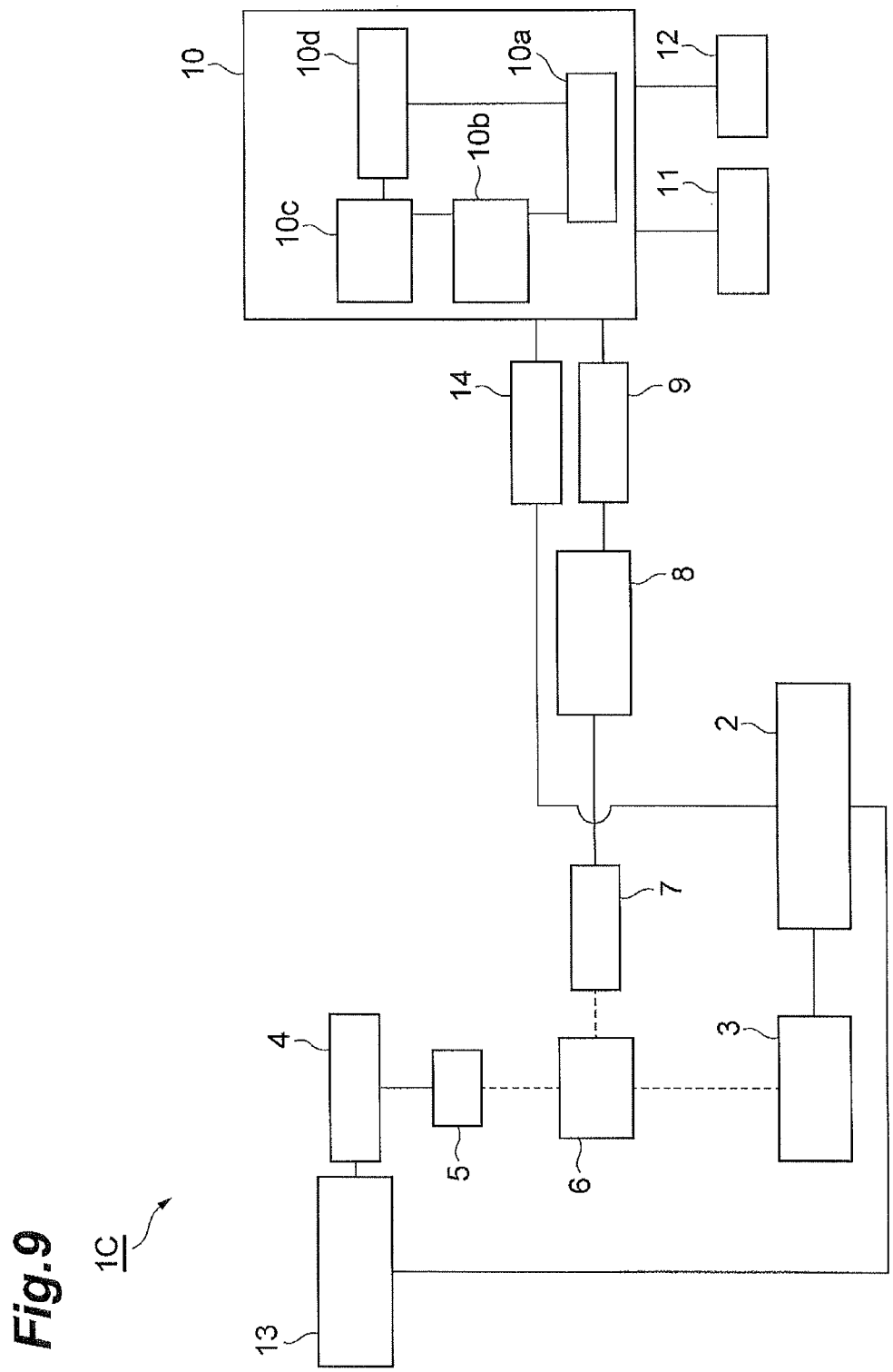
FIG. 9 is a diagram illustrating a configuration of a semiconductor device measurement apparatus according to a modification example.

While the preferred embodiments of the present invention have been described, the present invention is not limited to the embodiments. For example, while the case in which the pulse signal generated by the signal generation unit 13 based on the information on the fundamental frequency of the test pattern is input to the A/D converter 14 and the input waveform IN(t) is acquired has been described, the waveform acquisition unit 10a can generate the harmonic signal of the same order as the order of the pulse signal generated by the signal generation unit 13 when the pulse signal of the fundamental frequency of the test pattern is input to the waveform acquisition unit 10a. Therefore, as in a semiconductor device measurement apparatus 1C illustrated in FIG. 9, a configuration in which the pulse signal of the fundamental frequency of the test pattern output from the tester 2 may be input to the analysis apparatus 10 via the A/D converter 14 may be adopted. In this case, it is necessary to send frequency information of the pulse signal generated by the signal generation unit 13 to the analysis apparatus 10. However, basically, the analysis apparatus 10 can recognize the frequency information of the pulse signal because a configuration in which an instruction is issued from a PC constituting the analysis apparatus 10 to the signal generation unit 13 is adopted. Further, in addition to the configuration in which the information on the fundamental frequency of the test pattern is acquired from the tester 2, the information on the fundamental frequency of the test pattern may be input to the PC which is the analysis apparatus 10 using the input device 12.

Figure 10:
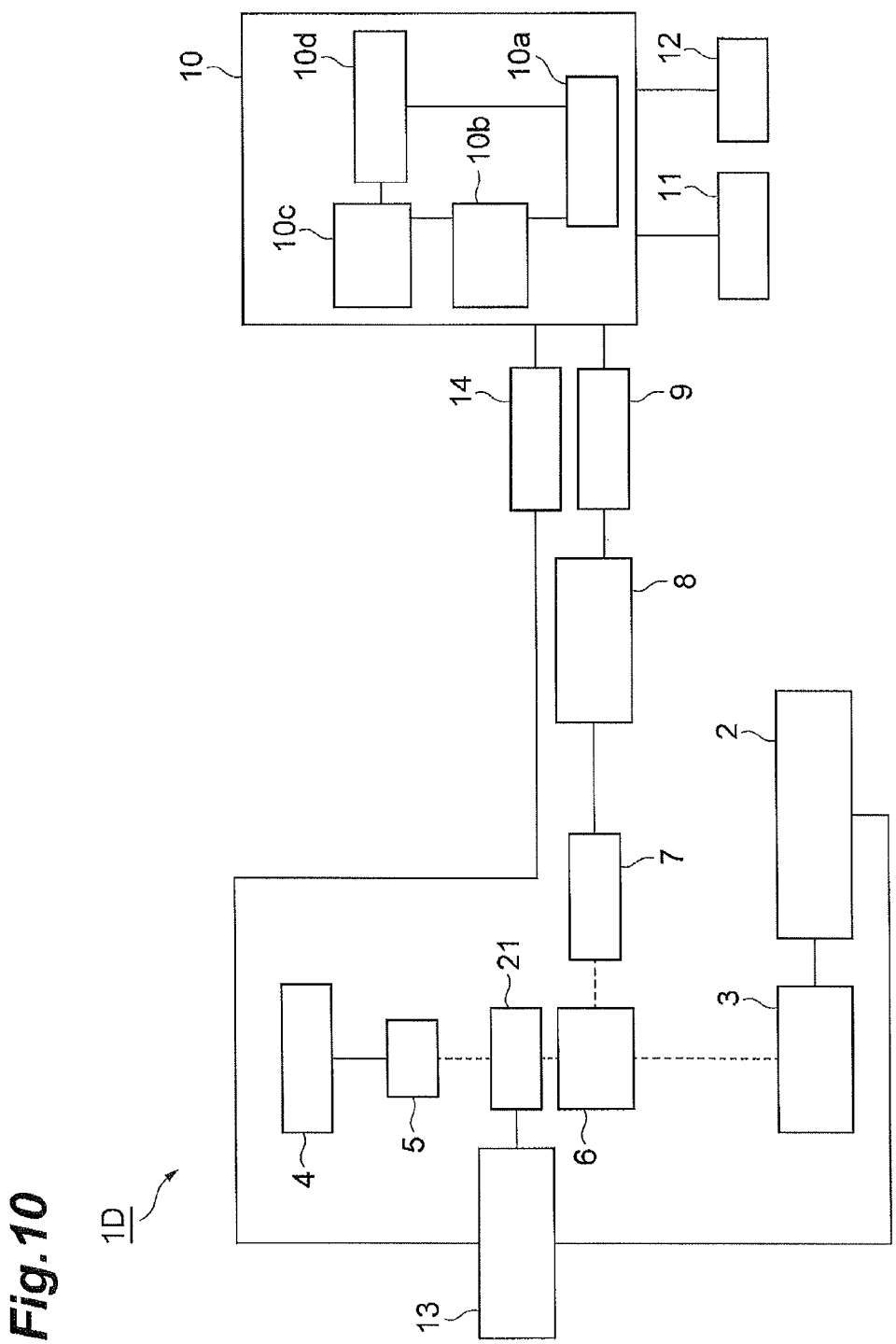
FIG. 10 is a diagram illustrating a configuration of a semiconductor device measurement apparatus according to the modification example.

Further, while the case in which the modulated light is generated from the light source 5 by inputting the pulse signal from the signal generation unit 13 to the light source control unit 4 has been described, for example, the light source 5 may have a configuration in which CW (Continuous Wave) light is output, a modulator 21 for modulating the CW light is provided between the light source 5 and the light branch optical system 6, and the modulator 21 and the signal generation unit 13 may be electrically connected, as in a semiconductor device measurement apparatus 1D illustrated in FIG. 10. In this case, the pulse signal from the signal generation unit 13 is received, and the light is modulated by the modulator 21. Further, a spatial light modulator or the like can be used as the modulator 21.

What is claimed is:

1. An apparatus for testing a semiconductor device, comprising:
    an operational signal generator configured to generate an operational signal to be input to the semiconductor device;
    a light source configured to generate light;
    an optics configured to illuminate the semiconductor device with the light;
    a detector configured to detect reflected light obtained by the semiconductor device reflecting the light, and output a detection signal;
    an amplifier configured to amplify the detection signal and output an amplified signal; and
    an analysis system configured to analyze an operation of the semiconductor device based on the amplified signal and a correction value,
    wherein the correction value is obtained based on a signal obtained by the amplifier amplifying a signal corresponding to a harmonic of a fundamental frequency of the operational signal.

2. The apparatus of claim 1, further comprising a signal generator configured to generate a pulse signal,
    wherein the correction value is obtained by the signal generator sequentially generating a harmonic signal which is a pulse signal of an $n^{th}$ harmonic of the fundamental frequency.

3. The apparatus of claim 2, wherein n is a positive integer.

4. The apparatus of claim 3, wherein n is $2^m$, and m is 0 or a positive integer.

5. The apparatus of claim 2, wherein the pulse signal has a duty ratio ranging from 40% to 60%.

6. The apparatus of claim 2,
    wherein the correction value is obtained by the light source generating modulated light modulated based on the harmonic signal generated by the signal generator and the detector detecting the modulated light and outputting a detection signal of the harmonic signal.

7. The apparatus of claim 2, wherein the correction value is obtained by the harmonic signal generated by the signal generator being input to the amplifier.

8. The apparatus of claim 1, wherein the analysis system corrects the amplified signal with the correction value, and reduces a high frequency component at a frequency higher than frequencies in a range in which the correction value is obtained among frequency components of the amplified signal after the correction.

9. The apparatus of claim 1, wherein the analysis system corrects the amplified signal with the correction value, and reduces a low frequency component lower than the fundamental frequency of the operational signal among frequency components of the amplified signal after the correction.

10. A method of testing a semiconductor device, comprising:
    generating an operational signal to be input to the semiconductor device;
    generating light;
    illuminating the semiconductor device with the light;
    detecting reflected light obtained by the semiconductor device reflecting the light, and outputting a detection signal;
    by amplifier, amplifying the detection signal and outputting an amplified signal; and
    analyzing an operation of the semiconductor device based on the amplified signal and a correction value,
    wherein the correction value is obtained based on a signal obtained by the amplifier amplifying a signal corresponding to a harmonic of a fundamental frequency of the operational signal.

11. The method of claim 10, further comprising generating a pulse signal,
wherein the correction value is obtained by sequentially generating a harmonic signal which is a pulse signal of an $n^{th}$ harmonic of the fundamental frequency.

12. The method of claim 11, wherein n is a positive integer.

13. The method of claim 12, wherein n is $2^m$, and m is 0 or a positive integer.

14. The method of claim 11, wherein the pulse signal has a duty ratio ranging from 40% to 60%.

15. The method of claim 11,
wherein the correction value is obtained by generating modulated light modulated based on the harmonic signal and detecting the modulated light and outputting a detection signal of the harmonic signal.

16. The method of claim 11, wherein the correction value is obtained by the harmonic signal being input to the amplifier.

17. The method of claim 10, wherein correcting the amplified signal with the correction value, and reducing a high frequency component at a frequency higher than frequencies in a range in which the correction value is obtained among frequency components of the amplified signal after the correction.

18. The method of claim 10, wherein correcting the amplified signal with the correction value, and reducing a low frequency component lower than the fundamental frequency of the operational signal among frequency components of the amplified signal after the correction.

* * * * *